United States Patent
Park et al.

(10) Patent No.: US 10,902,924 B2
(45) Date of Patent: Jan. 26, 2021

(54) MEMORY SYSTEM VARYING PASS VOLTAGE BASED ON ERASE COUNT OF TARGET MEMORY BLOCK AND OPERATING METHOD THEREOF

(71) Applicant: SK hynix Inc., Gyeonggi-do (KR)

(72) Inventors: Se Chang Park, Chungcheongbuk-do (KR); Jong Wook Kim, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/510,402

(22) Filed: Jul. 12, 2019

(65) Prior Publication Data
US 2020/0105351 A1    Apr. 2, 2020

(30) Foreign Application Priority Data
Sep. 28, 2018    (KR) ........................ 10-2018-0115720

(51) Int. Cl.
*G06F 3/06* (2006.01)
*G11C 16/26* (2006.01)
(Continued)

(52) U.S. Cl.
CPC .............. *G11C 16/26* (2013.01); *G06F 3/064* (2013.01); *G06F 3/0604* (2013.01); *G06F 3/065* (2013.01); *G06F 3/0652* (2013.01); *G06F 3/0659* (2013.01); *G06F 3/0679* (2013.01); *G11C 16/08* (2013.01); *G11C 16/24* (2013.01); *G11C 16/30* (2013.01); *G11C 16/349* (2013.01); *G11C 16/0483* (2013.01); *G11C 16/3427* (2013.01)

(58) Field of Classification Search
CPC ........ G06F 3/0604; G06F 3/064; G06F 3/065; G06F 3/0652; G06F 3/0659; G06F 3/0679; G11C 11/5628; G11C 11/5635; G11C 11/5642; G11C 16/0483; G11C 16/08; G11C 16/24; G11C 16/26; G11C 16/30; G11C 16/3427; G11C 16/349; G11C 16/3495
See application file for complete search history.

(56) References Cited

U.S. PATENT DOCUMENTS

2011/0261626 A1* 10/2011 Kim ...................... G11C 16/26
                                        365/185.22
2017/0076811 A1* 3/2017 Reusswig ............ G11C 16/349
(Continued)

FOREIGN PATENT DOCUMENTS

KR    1020150007397    1/2015
KR    101504339    3/2015
(Continued)

*Primary Examiner* — Larry T Mackall
(74) *Attorney, Agent, or Firm* — IP & T Group LLP

(57) ABSTRACT

A memory system includes a memory cell array including a plurality of memory cells; a peripheral circuit configured to apply a read voltage to a selected word line coupled to a selected memory cell among the memory cells, and apply a pass voltage to unselected word lines coupled to unselected memory cells other than the selected memory cell among the memory cells, during a read operation; and a controller configured to control the peripheral circuit, and apply a variable voltage level of the pass voltage based on status information of a target memory block which is the target of the read operation.

17 Claims, 7 Drawing Sheets

(51) Int. Cl.
*G11C 16/08* (2006.01)
*G11C 16/30* (2006.01)
*G11C 16/24* (2006.01)
*G11C 16/34* (2006.01)
*G11C 16/04* (2006.01)

(56) References Cited

U.S. PATENT DOCUMENTS

2017/0131904 A1* 5/2017 Rajwade ............... G06F 3/0604
2019/0325969 A1* 10/2019 Hong ..................... G11C 16/10

FOREIGN PATENT DOCUMENTS

| KR | 101516577 | 5/2015 |
| KR | 1020160004073 | 1/2016 |

* cited by examiner

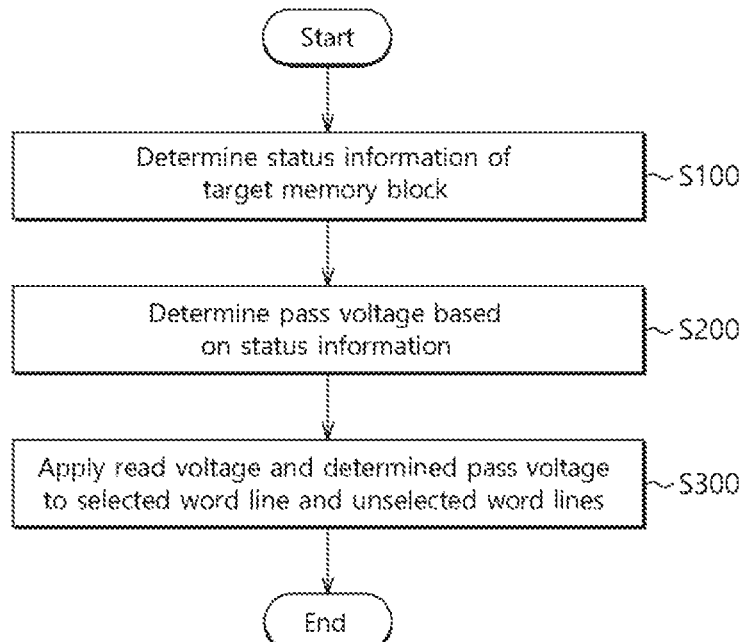

FIG.6
<Copy Block Selection Reference Table>
| Erase Count | Copy Block Selection Reference Value (Read Count) |
|---|---|
| EC_0 : 0 ~ 1k | 10k |
| EC_1 : 1k ~ 2k | 9k |
| EC_2 : 2k ~ 3k | 8k |
| EC_3 : 3k ~ | 7k |
FIG.7
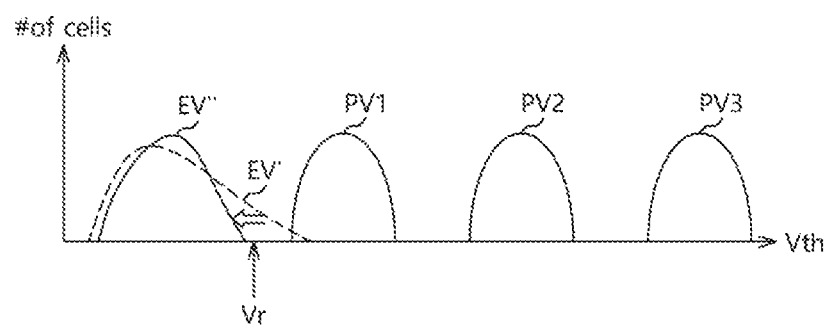
FIG.8
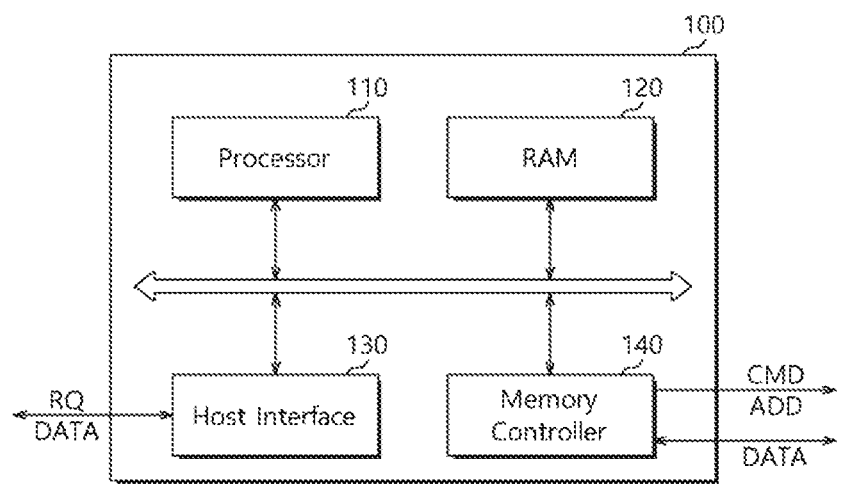

MEMORY SYSTEM VARYING PASS VOLTAGE BASED ON ERASE COUNT OF TARGET MEMORY BLOCK AND OPERATING METHOD THEREOF

CROSS-REFERENCES TO RELATED APPLICATION

The present application claims priority under 35 U.S.C. § 119(a) to Korean application number 10-2018-0115720, filed on Sep. 28, 2018, which is incorporated herein by reference in its entirety.

BACKGROUND

1. Technical Field

Various embodiments generally relate to a memory system, and more particularly, to a memory system including a nonvolatile memory device, and an operating method thereof.

2. Related Art

A memory system may be configured to store data provided from an external device in response to a write request of the external device. Furthermore, the memory system may be configured to provide data stored therein to the external device in response to a read request of the external device. Examples of the external device, as an electronic device capable of processing data, may include a computer, a digital camera, and a mobile phone. The memory system may be embedded in the external device, or separately fabricated and connected to the external device.

Since the memory system using a memory device has no mechanical driver, the memory system has excellent stability and durability, exhibits high information access speed, and has low power consumption. Examples of the memory system having such advantages may include a universal serial bus (USB) memory device, a memory card having various interfaces, a universal flash storage (UFS) device, and a solid status drive (SSD).

SUMMARY

Various embodiments are directed to a memory system capable of improving the reliability of a nonvolatile memory device by applying a pass voltage applied to unselected word lines during a read operation.

In an embodiment, a memory system may include: a memory cell array including a plurality of memory cells; a peripheral circuit configured to apply a read voltage to a selected word line coupled to a selected memory cell among the memory cells and apply a pass voltage to unselected word lines coupled to unselected memory cells other than the selected memory cell among the memory cells, during a read operation; and a controller configured to control the peripheral circuit, and apply a variable voltage level of the pass voltage based on status information of a target memory block which is the target of the read operation.

In an embodiment, an operating method for a memory system may include: determining status information of a target memory block in which read request data is stored; determining a pass voltage based on the status information; and applying a read voltage to a selected word line, and the determined pass voltage to the unselected word lines.

In an embodiment, a memory system may include: a memory device including a plurality of memory blocks; a controller suitable for determining an erase count value of a target memory block for a read operation among the plurality of memory blocks; and a peripheral circuit suitable for: generating a read voltage; generating a pass voltage based on the erase count value; and applying the read voltage and the pass voltage to a selected word line and unselected word lines, respectively, the selected word line coupled to a selected memory cell of the target memory block, and the unselected word lines coupled to unselected memory cells of the target memory block.

BRIEF DESCRIPTION OF THE DRAWINGS

FIG. 5A is a diagram illustrating a pass voltage level table.

FIGS. 5B and 5C are flowcharts illustrating an operating method for a memory system in accordance with an embodiment.

FIG. 6 is a diagram illustrating a copy block selection reference table.

FIG. 7 is a diagram illustrating a threshold voltage distribution indicating an erased cell distribution when a pass voltage is variably applied according to the erase count in accordance with the present embodiment.

FIG. 8 is a block diagram illustrating a controller in accordance with an embodiment.

DETAILED DESCRIPTION

Hereinafter, a memory system and an operating method thereof according to the present disclosure will be described below with reference to the accompanying drawings through exemplary embodiments.

Figure 1:
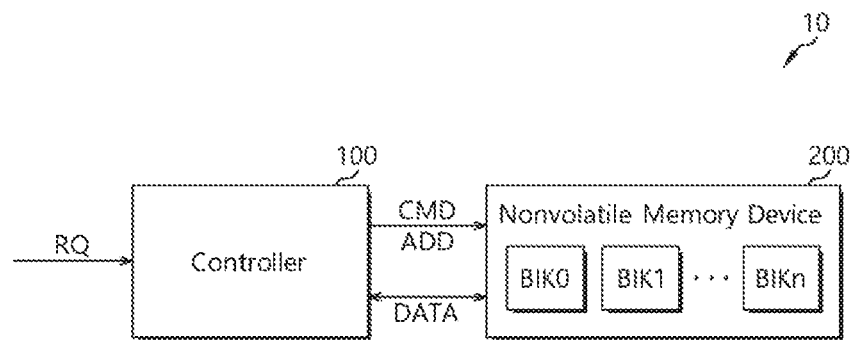
FIG. 1 is a block diagram illustrating a memory system in accordance with an embodiment.

FIG. 1 is a block diagram illustrating a memory system 10 in accordance with an embodiment.

Referring to FIG. 1, the memory system 10 may store data accessed by a host device (not illustrated) such as a mobile phone, MP3 player, laptop computer, desktop computer, game machine, television (TV), or in-vehicle infotainment system.

The memory system 10 may be fabricated as any one of various types of storage devices, according to a host interface indicating a transfer protocol with the host device. For example, the memory system 10 may be configured as any one of various types of storage devices which include a solid state driver (SSD), a multimedia card (MMC) such as an eMMC, RS-MMC or micro-MMC, a secure digital (SD) card such as an mini-SD or micro-SD, a universal serial bus (USB) storage device, a universal flash storage (UFS) device, a personal computer memory card international association (PCMCIA) card-type storage device, a peripheral component interconnection (PIC) card-type storage device, a PCI express (PCI-e or PCIe) card-type storage device, a compact flash (CF) card, a smart media card and a memory stick.

The memory system 10 may be fabricated as any one of various types of packages. For example, the memory system 10 may be fabricated as any one of various types of packages such as a package on package (PoP), a system in package (SiP), a system on chip (SoC), a multi-chip package (MCP), a chip-on-board (COB) package, a wafer-level fabricated package (WFP) and a wafer-level stack package (WSP).

The memory system 10 may include a controller 100 and a nonvolatile memory device 200.

The controller 100 may control overall operations of the nonvolatile memory device 200. The controller 100 may transfer a command CMD, an address ADD and data DATA to the nonvolatile memory device 200 or receive data DATA from the nonvolatile memory device 200, in response to a request RQ received from the host device.

Although not illustrated, the host device may communicate with the memory system 10 using an interface protocol such as PCI-e (Peripheral Component Interconnect—Express), ATA (Advanced Technology Attachment), SATA (Serial ATA), PATA (Parallel ATA) or SAS (serial attached SCSI).

The nonvolatile memory device 200 may be configured as any one of various types of nonvolatile memory devices including a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PCRAM) using chalcogenide alloys, and a resistive random access memory (ReRAM or RRAM) using transition metal oxide.

The nonvolatile memory device 200 may include a memory cell array. Memory cells included in the memory cell array may be configured as a hierarchical memory cell group or on a memory cell basis, from an operational point of view, or from a physical or structural point of view. For example, memory cells which are coupled to the same word line, and are read and written (or programmed) at the same time may be configured as a page. Furthermore, memory cells which are deleted at the same time may be configured as a memory block. The memory cell array may include a plurality of memory blocks Blk0 to Blkn, and each of the memory blocks may include a plurality of pages.

The nonvolatile memory device 200 may perform a program, read, or erase operation in response to a command CMD and data DATA received from the controller 100.

Figure 2:
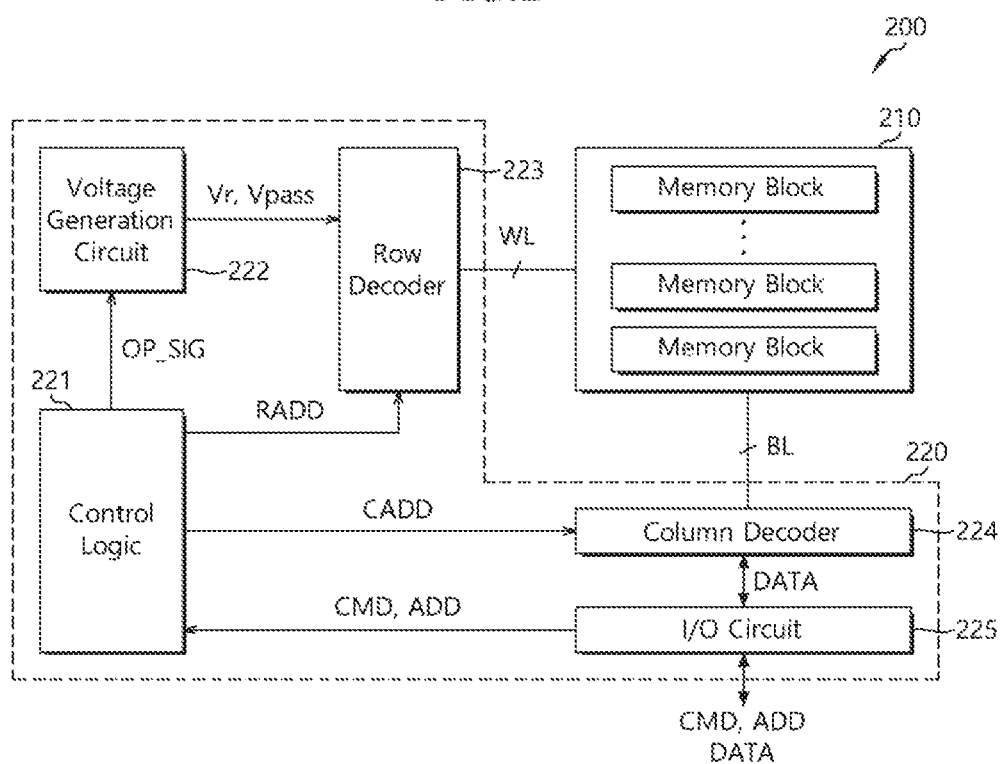
FIG. 2 is a diagram illustrating a nonvolatile memory device in accordance with an embodiment.

FIG. 2 is a diagram illustrating a nonvolatile memory device in accordance with an embodiment, for example, the nonvolatile memory device 200 of FIG. 1.

Referring to FIGS. 1 and 2, the nonvolatile memory device 200 may include a memory cell array 210 configured to store data DATA and a peripheral circuit 220. The peripheral circuit 220 is configured to program data DATA to the memory cell array 210, read data DATA stored in the memory cell array 210, or erase data DATA stored in the memory cell array 210.

The memory cell array 210 may include memory cells (e.g., MC0 to MC8 of FIG. 3) arranged at the respective intersections between word lines WL and bit lines BL. The memory cell array 210 may include a plurality of memory blocks. The plurality of memory blocks may be coupled to the word lines WL and the bit lines BL. The word lines WL may be coupled to the corresponding memory blocks, and the bit line BL may be coupled to the memory blocks in common. The memory blocks may include cell strings with a two-dimensional or three-dimensional structure. Each of the cell strings may include a plurality of memory cells. The memory cells of the cell string with a two-dimensional structure may be arranged in a direction parallel to a substrate. The memory cells of the cell string with a three-dimensional structure may be arranged in a direction perpendicular to the substrate.

The peripheral circuit 220 may include a control logic 221, a voltage generation circuit 222, a row decoder 223, a column decoder 224, and an input and output (input/output) (I/O) circuit 225.

The control logic 221 may control overall operations of the nonvolatile memory device 200 based on a control signal provided from an external device, that is, the controller 100. For example, the control logic 221 may control a read operation, a program operation, and an erase operation of the nonvolatile memory device 200.

The control logic 221 may generate an operation signal OP_SIG, a row address RADD, and a column address CADD based on a command CMD and address ADD provided from the controller 100. The control logic 221 may output the generated operation signal OP_SIG, row address RADD, and column address CADD to the voltage generation circuit 222, the row decoder 223 and the column decoder 224, respectively.

During a read operation, the control logic 221 may control the voltage generation circuit 222 and the row decoder 223 to select a word line (or memory cell) corresponding to a read address and to apply a read voltage Vr to the selected word line (or selected memory cell). Furthermore, the control logic 221 may control the voltage generation circuit 222 to adjust the level of a pass voltage Vpass applied to unselected word lines according to status information of a target memory block, i.e. a memory block corresponding to the read address. Here, the status information may indicate an erase count, but is not specifically limited thereto. For example, the control logic 221 may control the voltage generation circuit 222 to reduce the level of the pass voltage Vpass applied to the unselected word lines when the erase count of the target memory block is increased.

The voltage generation circuit 222 may generate a voltage used for an internal operation of the nonvolatile memory device 200. The voltages generated by the voltage generation circuit 222 may be applied to memory cells of the memory cell array 210. For example, during a program operation, a program voltage may be applied to a word line of memory cells on which the program operation is to be performed. For another example, during an erase operation, an erase voltage may be applied to well regions of memory cells on which the erase operation is to be performed. For another example, during a read operation, a read voltage Vr may be applied to a word line of memory cells on which the read operation is to be performed.

The voltage generation circuit 222 may generate operation voltages having various levels, which are used for the program, read, and erase operations, based on the operation signal OP_SIG received from the control logic 221. For example, during the read operation, the voltage generation circuit 222 may generate the read voltage Vr and the pass voltage Vpass based on the operation signal OP_SIG received from the control logic 221. The pass voltage Vpass may be set to a positive voltage greater than 0V.

The row decoder 223 may be coupled to the memory cell array 210 through the word lines WL. The row decoder 223 may operate under control of the control logic 221. The row decoder 223 may decode a row address RADD received from the control logic 221. The row decoder 223 may select and drive a word line WL based on the decoding result. For example, the row decoder 223 may provide the word lines WL with a word line voltage received from the voltage generation circuit 222.

The column decoder 224 may operate under control of the control logic 221. The column decoder 224 may decode a column address CADD received from the control logic 221. The column decoder 224 may couple read/write circuits of a data read/write block (not illustrated) corresponding to the respective bit lines BL to a data input/output line (or data input/output buffer), based on the decoding result. The column decoder 224 may exchange data DATA with the selected memory block through a bit line BL corresponding to the column address CADD.

The input/output circuit 225 may receive a command CMD, an address ADD and data DATA from the controller 100, and transfer data DATA to the controller 100. The input/output circuit 225 may provide the control logic 221 with the command CMD and the address ADD, which are received from the controller 100. The input/output circuit 225 may exchange data DATA with the column decoder 224, the data DATA including data received from the controller 100 and data to be transferred to the controller 100.

Although not illustrated in FIG. 2, the peripheral circuit 220 may include a data read/write block. The data read/write block may be coupled to the memory cell array 210 through the bit lines BL. The data read/rite block may include the read/write circuits (not illustrated) corresponding to the respective bit lines BL. The data read/write block may operate under control of the control logic 221.

The data read/write block may operate as a write driver or a sense amplifier, depending on operation modes. For example, the data read/write block may operate as a write driver which stores data DATA provided from the controller 100 in the memory cell array 210 during a write operation. Furthermore, the data read/write block may operate as a sense amplifier which reads data DATA from the memory cell array 210 during a read operation.

Figure 3:
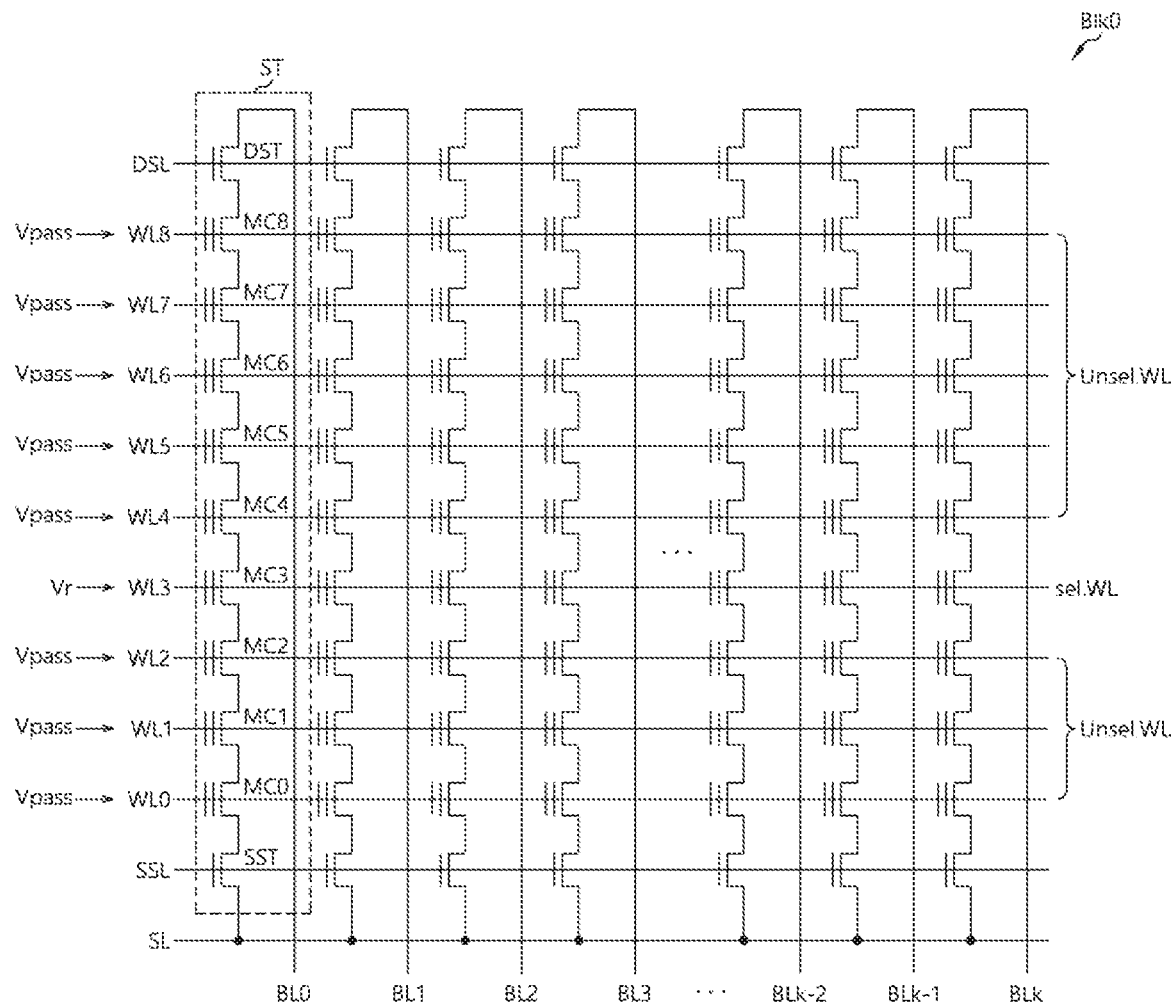
FIG. 3 is a circuit diagram illustrating a memory block in accordance with an embodiment.

FIG. 3 is a circuit diagram illustrating a memory block in accordance with an embodiment, for example, a memory block of FIG. 2. By way of example, the memory block Blk0 of FIG. 1 will be described.

Referring to FIG. 3, the memory block Blk0 may include a plurality of cell strings ST coupled between the bit lines BL0 to BLk and a source line SL. Any one cell string ST of the plurality of cell strings will be exemplified as follows.

The cell string ST may include a source select transistor SST, memory cells MC0 to MC8, and a drain select transistor DST which are coupled in series between the source line SL and the bit line BL0. The gate of the source select transistor SST may be coupled to a source select line SSL. The gates of the memory cells MC0 to MC8 may be coupled to word lines WL0 to WL8, respectively. The gate of the drain select transistor DST may be coupled to a drain select line DSL. The number of the source select transistor SST, the memory cells MC0 to MC8 and the drain select transistor DST may differ depending on nonvolatile memory devices.

In the present embodiment, the read operation may be performed by applying the read voltage Vr to a selected word line Sel.WL coupled to read target memory cells and applying the pass voltage Vpass to the other unselected word lines Unsel.WL. The pass voltage Vpass may be set to a positive voltage greater than 0V. Furthermore, when the memory cells coupled to the selected word line Sel.WL are read, a turn-on voltage may be selectively applied to the drain select line DSL and the source select line SSL.

Figure 4:
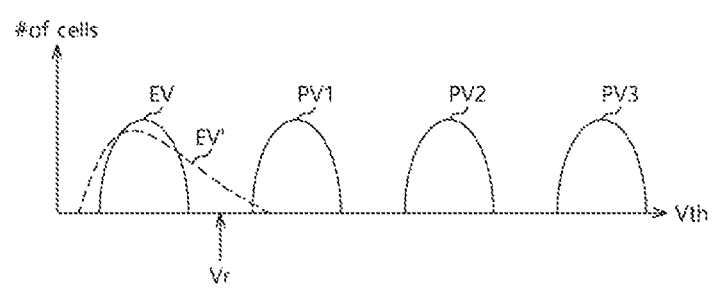
FIG. 4 is a diagram illustrating a threshold voltage distribution in which an erased cell distribution spreads as an erase count increases.

FIG. 4 is a diagram illustrating a threshold voltage distribution in which an erased cell distribution spreads as an erase count increases.

Referring to FIG. 4, a 2-bit multi-level cell (MLC) may be erased or programmed to have a threshold voltage distribution corresponding to any one of an erase state EV and a plurality of program states PV1, PV2 and PV3, depending on multi-bit data thereof, i.e. the least significant bit (LSB) data and the most significant bit (MSB) data. During a read operation, any one of a first read voltage Vr having a voltage level between the erase state EV and the first program state PV1, a second read voltage having a voltage level between the first program state PV1 and the second program state PV2, and a third read voltage having a voltage level between the second program state PV2 and the third program state PV3 may be applied to a memory cell. By way of example, FIG. 4 illustrates only the first read voltage Vr. In this specification, "read voltage" indicates the first read voltage.

When the second read voltage is applied, a memory cell having a threshold voltage distribution of the erase state EV and the first program state PV1 may be determined as an on-cell in which the least significant bit (LSB) data "1." is stored, and a memory cell having a threshold voltage distribution of the second program state PV2 and the third program state PV3 may be determined as an off-cell in which the LSB data "0" is stored.

When the first read voltage Vr is applied, a memory cell having a threshold voltage distribution of the erase state EV may be determined as an on-cell in which the most significant bit (MSB) data "1" is stored, and a memory cell having a threshold voltage distribution of the first program state PV1 may be determined as an off-cell in which the MSB data "0" is stored. When the third read voltage is applied, a memory cell having a threshold voltage distribution of the second program state PV2 may be determined as an on-cell in which the MSB data "1" is stored, and a memory cell having a threshold voltage distribution of the third program state PV3 may be determined as an off-cell in which the MSB data "0" is stored.

In the present embodiment, the MLC for storing 2-bit data will be exemplified. However, the present embodiment may also be applied in the same manner to a single level cell (SLC) for storing 1-bit data or an MLC for storing 3-bit or more data.

With the development of the fabrication process technology, the space between memory cells has decreased. Thus, threshold voltage distributions of memory cells may be widened by coupling between the memory cells, and adjacent threshold voltage distributions may overlap each other. Furthermore, the increase in the number of bits of data stored in a memory cell may degrade the reliability of data programmed to the memory cell or data read from the memory cell.

Furthermore, a memory cell may be deteriorated as the usage count, that is, the program/erase (PIE) count of the memory cell is increased. The deteriorated memory cell may not be normally erased, compared to a normal memory cell. For example, normal memory cells of which the P/E counts are "0" may be completely erased to form a threshold voltage distribution EV, when a predetermined number of erase operations are repeatedly performed. However, deteriorated memory cells of which the P/E counts are "2,000"

may not be completely erased to form a threshold voltage distribution EV', even though the same number of erase operations are performed.

Since memory cells of which the usage counts are relatively high, among memory cells included in the same memory block, are further deteriorated than the other memory cells and not completely erased, there may be a memory cell having a higher voltage distribution than the read voltage Vr, like the threshold voltage distribution EV' illustrated in FIG. 4. For example, when a memory block is erased after some of memory cells included in the corresponding memory block are programmed, the memory cells may have substantially different usage counts even though the memory cells are included in the same memory block. Thus, in the memory block, memory cells coupled to a word line which is earlier in a program order may be further deteriorated than memory cells coupled to a word line which is later in the program order. The program order may indicate the order of a word line which is selected among the word lines when a program operation is performed on a memory block.

As described above, the pass voltage may be applied to the unselected word lines during the read operation. In this case, when a constant pass voltage is applied regardless of how much the memory cells are deteriorated, a pass voltage having an unnecessarily high level or a pass voltage having a level less than a required level may be applied to increase the number of error bits. As a result, the reliability of the read operation may be degraded.

That is, as data is programmed to the memory cell, the memory cell may form a constant threshold voltage to have an interference effect on adjacent memory cells. The memory cells to which the interference effect is applied may have a different threshold voltage from the threshold voltage formed when the data is programmed, and form a shifted threshold voltage distribution EV' as illustrated in FIG. 4. As the interference effect is increased, the threshold voltage may be significantly changed. As a result, the data stored in the memory cell is highly likely to be changed or lost.

Figure 5C:
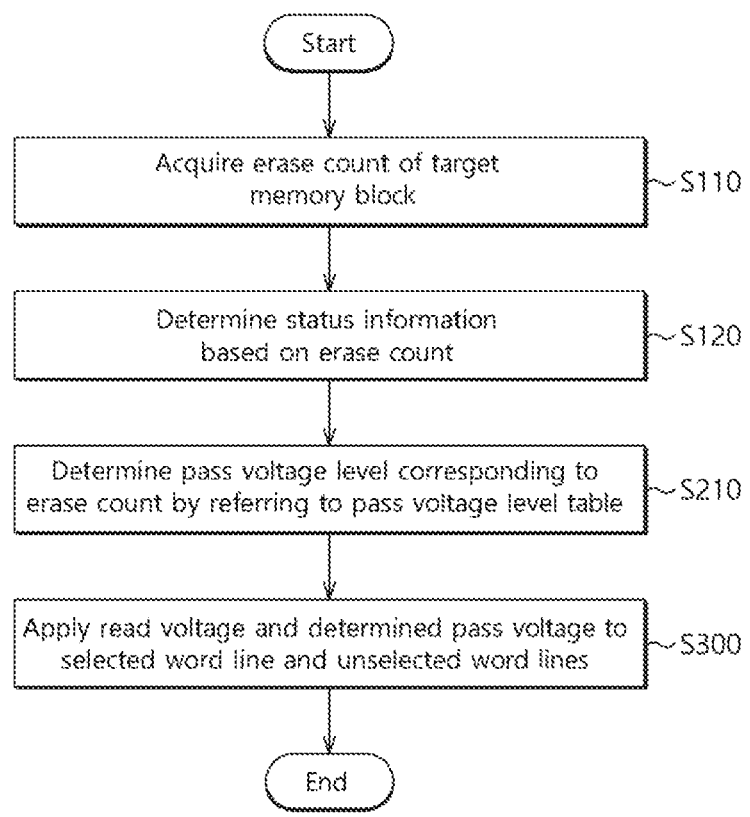

FIG. 5A is a diagram illustrating a pass voltage level table in which the level of the pass voltage is variably applied according to an erase count, and FIGS. 5B and 5C are flowcharts illustrating an operating method of the memory system in accordance with an embodiment. Hereafter, the example in which the voltage level of the pass voltage Vpass is variably applied based on status information will be described with reference to FIGS. 1 to 3 and 5A to 5C.

The memory system 10 of FIG. 1 may include the memory cell array 210, the peripheral circuit 220 and the controller 100. The memory cell array 210 may include a plurality of memory cells. The peripheral circuit 220 may be configured to apply the read voltage Vr to a selected word line Sel.WL coupled to a memory cell selected among the memory cells and apply the pass voltage Vpass to unselected word lines Unsel.WL coupled to memory cells other than the selected memory cell, during a read operation of the selected memory cell. The controller 100 may control the peripheral circuit 220, and variably apply the voltage level of the pass voltage Vpass based on status information of a target memory block which is the target of the read operation. In an embodiment, the status information may be generated based on the erase count of the target memory block. Hereafter, the embodiment in which the status information is determined based on the erase count will be exemplified.

Referring to FIG. 5A, the memory system 10 may variably apply the level of the pass voltage Vpass applied during the read operation, according to the erase count of the target memory block. As illustrated in FIG. 5A, the levels of the pass voltage Vpass, corresponding to a plurality of erase count ranges, respectively, may be set and stored in the form of a table. At this time, the pass voltage level table may be stored in a random access memory (not illustrated) of the controller 100 or a specific region of the nonvolatile memory device 200.

In the pass voltage level table, an erase count EC_0 may indicate an erase count range of 0 to 1,000 (i.e., 1k). Similarly, an erase count EC_1 may indicate an erase count range of 1,000 (i.e., 1k) to 2,000 (i.e., 2k), an erase count EC_2 may indicate an erase count range of 2,000 (i.e., 2k) to 3,000 (i.e., 3k), and an erase count EC_3 may indicate an erase count range of 3,000 (i.e., 3k) or more.

The levels of the pass voltage Vpass, corresponding to the respective erase count ranges, may be stored in the pass voltage level table. For example, the erase count EC_0 may correspond to the level of a pass voltage Vpass of 7V, the erase count EC_1 may correspond to the level of a pass voltage Vpass of 6.5V, the erase count EC_2 may correspond to the level of a pass voltage Vpass of 6V, and the erase count EC_3 may correspond to the level of a pass voltage Vpass of 5.5V. That is, in the present embodiment, when the erase count of the target memory block is increased, the level of the pass voltage Vpass used in a read operation for the target memory block may be decreased.

Referring to FIG. 5B, the operating method of the memory system 10 may include step S100, step S200 and step S300. The step S100 may include a step of determining status information of the target memory block in which read request data is stored. The step S200 may include a step of determining a pass voltage Vpass to be applied to the unselected word lines Unsel.WL based on the status information. The step S300 may include a step of applying the read voltage Vr to the selected word line Sel.WL and applying the determined pass voltage Vpass to the unselected word lines Unsel.WL.

In an embodiment, the step S300 may include the step of generating the read voltage Vr and the pass voltage Vpass in response to the operation signal OP_SIG, and transferring the generated voltages to the selected word line Sel.WL and the unselected word lines Unsel.WL in response to the row address RADD.

Referring to FIG. 5C, the step S100 of determining the status information of the target memory block may include step S110 of acquiring the erase count of the target memory block and step S120 of determining the status information based on the acquired erase count. Furthermore, step S200 of determining the pass voltage Vpass based on the status information may include step S210 of determining the level of the pass voltage Vpass corresponding to the erase count by referring to the pass voltage level table.

When a read request RQ is received from the host device, the controller 100 may acquire the erase count of the target memory block in which data to be read is stored, and determine the level of the pass voltage Vpass which is applied to the unselected word lines Unsel.WL during a read operation, based on the acquired erase count and the pass voltage level table.

The controller 100 may provide the nonvolatile memory device 200 with a command CMD including the determined pass voltage level Vpass. The control logic 221 of the nonvolatile memory device 200 may provide the voltage generation circuit 222 with the operation signal OP_SIG which is generated based on the command CMD received from the controller 100. The voltage generation circuit 222 may generate the read voltage Vr and the determined pass voltage Vpass according to the operation signal OP_SIG provided from the control logic 221. The generated read voltage Vr and pass voltage Vpass may be applied to the memory cell array 210 through the word lines WL.

For example, when the erase count of the target memory block is '800', the controller 100 may check that the erase count '800' of the target memory block is included in the erase count EC_0, by referring to the pass voltage level table of FIG. 5A. Further, the controller 100 may determine the pass voltage level Vpass corresponding to the erase count EC_0, i.e. a pass voltage level of 7V, as the pass voltage level Vpass to be used during the read operation of the target memory block. For another example, when the erase count of the target memory block is '1,500', the controller 100 may check that the erase count '1,500' of the target memory block is included in the erase count EC_1, by referring to the pass voltage level table. Further, the controller 100 may determine the pass voltage level Vpass corresponding to the erase count EC_1, i.e. a pass voltage level of 6.5V, as the pass voltage level Vpass to be used during the read operation of the target memory block. For another example, when the erase count of the target memory block is '4,000', the controller 100 may check that the erase count '4,000' of the target memory block is included in the erase count EC_3, by referring to the pass voltage level table. Further, the controller 100 may determine the pass voltage level Vpass corresponding to the erase count EC_3, i.e. a pass voltage level of 5.5V, as the pass voltage level Vpass to be used during the read operation of the target memory block.

In the present embodiment, according to the status information (for example, erase count) of the target memory block in which read data is stored, the level of the pass voltage Vpass applied to the unselected word lines Sel.WL during the read operation may be variably applied to reduce a shift of the threshold voltage distribution by read disturb, which makes it possible to improve the reliability of the data read operation. The effect of this configuration will be described below in detail with reference to FIG. 7.

FIG. 6 is a diagram illustrating a copy block selection reference table in which a copy block selection reference value is variably applied according to an erase count. Hereafter, the example in which the copy block selection reference value is variably applied based on status information in accordance with the present embodiment will be described with reference to FIGS. 1 to 3 and 6.

The controller 100 of FIG. 1 may manage copy block selection reference values for selecting a memory block which is the target of an internal copy operation for data stored in the memory cell array 210. Further, the controller 100 may variably apply a copy block selection reference value depending on status information. At this time, the copy block selection reference value may be set based on each of the read counts of the respective memory blocks. The following descriptions will be based on the embodiment that the status information is determined based on the erase count of the target memory block and the copy block selection reference value is based on the read count of the target memory block.

In an embodiment, the copy block selection reference value may indicate a reference value for selecting a memory block which is the target of an internal copy operation for data stored in the memory cell array 210. Furthermore, the internal copy operation may indicate a garbage collection or read reclaim operation. However, the present embodiment is not limited thereto, but the internal copy operation may be applied to all operations for moving internal data of the nonvolatile memory device 200.

Referring to FIG. 6, the memory system 10 may apply the various copy block selection reference values, according to the erase count of the target memory block. In an embodiment, read counts corresponding to erase count ranges may be set and stored in the form of a table, as illustrated in FIG. 6. At this time, a copy block selection reference table may be stored in the RAM of the controller 100 or a specific region of the nonvolatile memory device 200.

In the copy block selection reference table, an erase count EC_0 may indicate an erase count range of 0 to 1,000 (i.e., 1k). Similarly, an erase count EC_1 may indicate an erase count range of 1,000 (i.e., 1k) to 2,000 (i.e., 2k), an erase count EC_2 may indicate an erase count range of 2,000 (i.e., 2k) to 3,000 (i.e., 3k), and an erase count EC_3 may indicate an erase count range of 3,000 (i.e., 3k) or more.

The read counts corresponding to the respective erase count ranges may be stored in the copy block selection reference table. For example, the erase count EC_0 may correspond to a read count of 10,000 (i.e., 10k), the erase count EC_1 may correspond to a read count of 9,000 (i.e., 9k), the erase count EC_2 may correspond to a read count of 8,000 (i.e., 8k), and the erase count EC_3 may correspond to a read count of 7,000 (i.e., 7k). That is, in the present embodiment, when the erase count of the target memory block is increased, the read count which is the copy block selection reference value may be reduced and applied.

The operating method of the memory system 10 may include the steps of: determining a copy block selection reference value for selecting a memory block as the target of an internal copy operation based on status information; and performing the internal copy operation on a memory block which satisfies the copy block selection reference value. The step of determining the copy block selection reference value may include the step of determining whether the read count (for example, actual read count) of each of the memory blocks has reached the status information of the corresponding memory block, i.e. the read count (for example, reference read count) corresponding to the erase count.

For example, when the erase count of the target memory block is '800', the controller 100 may check that the erase count '800' of the target memory block is included in the erase count EC_0 (i.e., 0-1k), by referring to the pass voltage level table of FIG. 5A. Further, the controller 100 may check a read count of 10k corresponding to the erase count EC_0 by referring to the copy block selection reference table of FIG. 6. Furthermore, the controller 100 may compare the actual read count of the target memory block to the reference read count of 10k, and determine whether to select the target memory block as a copy block. For example, the controller 100 may select the target memory block as the copy block when the actual read count of the target memory block is greater than or equal to the reference read count. The controller 100 may not select the target memory block as the copy block when the actual read count of the target memory block is less than the reference read count.

For another example, when the erase count of the target memory block is '1,500', the controller 100 may check that the erase count '1,500' of the target memory block is included in the erase count EC_1 (i.e., 1k-2k), by referring to the pass voltage level table of FIG. 5A. Further, the controller 100 may check a read count of 9k corresponding to the erase count EC_1 by referring to the copy block selection reference table of FIG. 6. Therefore, the controller 100 may apply the read count of 9k as the reference read count for determining whether to select the target memory block as a copy block.

In the present embodiment, a reference read count for selecting a memory block in which a copy operation is to be performed may be variably applied according to the status information of the corresponding memory block, i.e. the erase count.

In the present embodiment, the copy block selection reference value (for example, read count) for selecting the target memory block of the internal copy operation (for example, garbage collection) may be variably applied according to the status information of the target memory block in which data are stored, that is, the erase count, which makes it possible to improve the reliability of the system. The effect of this configuration will be described below in detail with reference to FIG. 7.

FIG. 7 is a diagram illustrating a threshold voltage distribution diagram indicating an erased cell distribution when a pass voltage is variably applied according to the erase count in accordance with the present embodiment.

Referring to FIGS. 4 and 7, when a pass voltage level applied to unselected word lines during a read operation is variably applied according to the erase count of a target memory block, it is possible to minimize a shift of erased cell distribution, caused by interference of adjacent memory cells or deterioration.

That is, the spread of voltage distribution EV''' of the erased cells may be smaller than the spread of voltage distribution EV' of the erased cells. The spread of voltage distribution EV''' of the erased cells when the read operation is performed by applying the pass voltage to the unselected word lines is varied according to the erase count of the target memory block. The spread of voltage distribution EV' of the erased cells when the read operation is performed by applying a constant pass voltage to the unselected word lines regardless of the erase count of the target memory block. Thus, since the probability that an error will occur in the read operation may be reduced through the application of the read voltage Vr, the reliability of the read operation may be improved.

Furthermore, the copy block selection reference value for the target memory cell of the internal copy operation may be variably applied while the pass voltage level is variably applied. Thus, it is possible to prevent a reduction in lifetime of a memory cell, which may occur when an opportunity for the internal copy operation (for example, garbage collection or read reclaim) is missed. As a result, the lifetime of the system may be improved.

FIG. 8 is a block diagram illustrating a controller (e.g., the controller 100 of FIG. 1) in accordance with the present embodiment.

Referring to FIGS. 1 and 8, the controller 100 of the memory system 10 may include a processor 110, a random access memory (RAM) 120, a host interface 130, and a memory controller 140.

The processor 110 may include a micro control unit (MCU) and a central processing unit (CPU). The processor 110 may process a request received from the host device. In order to process the request, the processor 110 may drive a code-based instruction or algorithm loaded to the RAM 120, i.e. firmware FW, and control the internal function blocks and the nonvolatile memory device 200.

The RAM 120 may include a dynamic RAM (DRAM) or static RAM (SRAM). The RAM 120 may store firmware FW driven by the processor 110. Furthermore, the RAM 120 may store data required for driving the firmware FW, for example, metadata. That is, the RAM 120 may operate as a working memory of the processor 110. In an embodiment, the RAM 120 may store a pass voltage level table and a copy block selection reference table. In the pass voltage level table, pass voltage levels matched with status information for the respective memory blocks of the nonvolatile memory device 200 are stored. In the copy block selection reference table, copy block selection reference values matched with the status information for the memory blocks are stored.

The host interface 130 may interface a host device (not illustrated) and the memory system 10. For example, the host interface 130 may communicate with the host device using one or more of standard transfer protocols such as secure digital (SD), Universal Serial Bus (USB), Multi-Media Card (MMC), Embedded MMC (eMMC), Personal Computer Memory Card International Association (PCM-CIA), Parallel Advanced Technology Attachment (PATA), Serial Advanced Technology Attachment (SATA), Small Computer System Interface (SCSI), Serial Attached SCSI (SAS), Peripheral Component Interconnection (PCI), PCI Express (PCI-e) and Universal Flash Storage (UFS). For example, as illustrated in FIG. 8, the host interface 130 may receive a request RQ from the host device, and transfer and receive data DATA to and from the host device.

The memory controller 140 may control the nonvolatile memory device 200 of FIGS. 1 and 2 under control of the processor 110. The memory controller 140 may also be referred to as a memory interface. The memory controller 140 may provide control signals to the nonvolatile memory device 200. The control signals may include a command CMD, an address ADD and a control signal for controlling the nonvolatile memory device 200. The memory controller 140 may provide data DATA to the nonvolatile memory device 200, or receive data DATA from the nonvolatile memory device 200. For example, as illustrated in FIG. 8, the memory controller 140 may transfer the command CMD, the address ADD and the data DATA to the nonvolatile memory device 200 or receive the data DATA from the nonvolatile memory device 200, in response to the request RQ received from the host device.

In accordance with the present embodiments, the memory system may prevent a shift in voltage distribution of erased cells, thereby improving the reliability of the read operation.

Furthermore, the memory system may variably apply a reference value of a memory block in which an internal copy operation is to be performed, depending on status information of the memory block, thereby improving the lifetime of the device.

Figure 9:
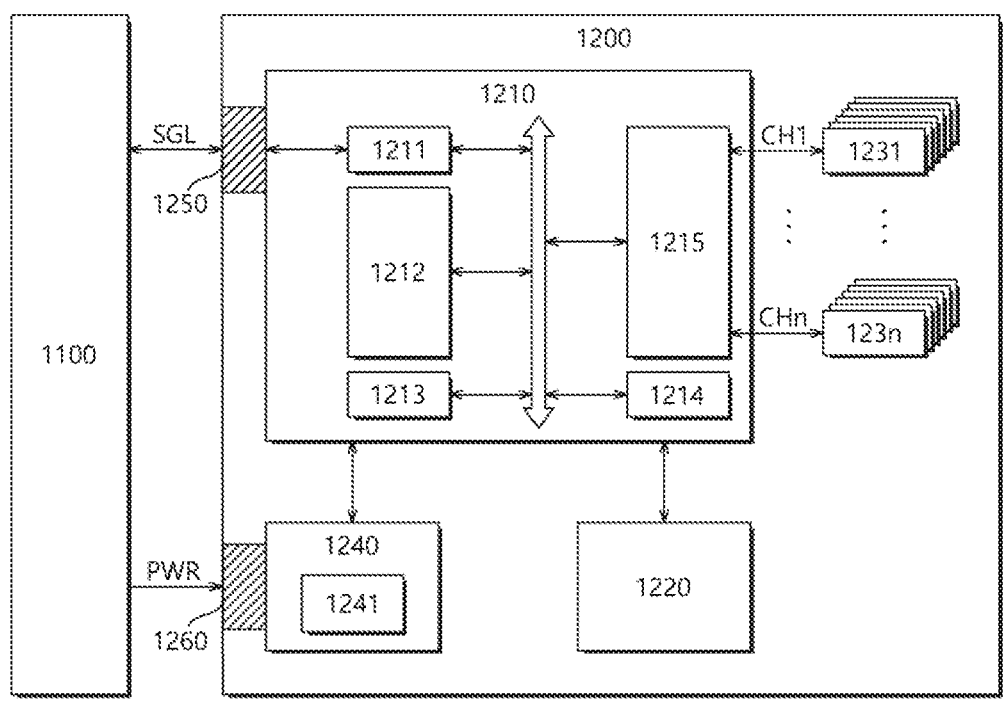
FIG. 9 is a diagram illustrating a data processing system including a solid state drive (SSD) in accordance with an embodiment of the present disclosure.

FIG. 9 is a diagram illustrating an example of a data processing system 1000 including a solid state drive (SSD) in accordance with an embodiment. Referring to FIG. 9, the data processing system 1000 may include a host device 1100 and an SSD 1200.

The SSD 1200 may include a controller 1210, a buffer memory device 1220, nonvolatile memory devices 1231 to 123n, a power supply 1240, a signal connector 1250, and a power connector 1260.

The controller 1210 may control general operations of the SSD 1200. The controller 1210 may include a host interface unit 1211, a control unit 1212, a random access memory 1213, an error correction code (ECC) unit 1214 and a memory control unit 1215.

The memory control unit 1215 may provide control signals such as commands and addresses to the nonvolatile memory devices 1231 to 123n, according to control of the control unit 1212. Moreover, the memory control unit 1215 may exchange data with the nonvolatile memory devices 1231 to 123n, according to control of the control unit 1212. For example, the memory control unit 1215 may provide the data stored in the buffer memory device 1220, to the nonvolatile memory devices 1231 to 123n, or provide the data read out from the nonvolatile memory devices 1231 to 123n, to the buffer memory device 1220.

The host interface unit 1211 may exchange a signal SGL with the host device 1100 through the signal connector 1250. The signal SGL may include a command, an address, data, and so forth. The host interface unit 1211 may interface the host device 1100 and the SSD 1200 according to the protocol of the host device 1100. For example, the host interface unit 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-e or PCIe) and universal flash storage (UFS).

The control unit 1212 may analyze and process a signal SGL inputted from the host device 1100. The control unit 1212 may control operations of internal function blocks according to a firmware or a software for driving the SSD 1200. The random access memory 1213 may be used as a working memory for driving such a firmware or software.

The ECC unit 1214 may generate the parity data of data to be transmitted to the nonvolatile memory devices 1231 to 123n. The generated parity data may be stored together with the data in the nonvolatile memory devices 1231 to 123n, The ECC unit 1214 may detect an error of the data read out from the nonvolatile memory devices 1231 to 123n, based on the parity data. If a detected error is within a correctable range, the ECC unit 1214 may correct the detected error.

The buffer memory device 1220 may temporarily store data to be stored in the nonvolatile memory devices 1231 to 123n. Further, the buffer memory device 1220 may temporarily store the data read out from the nonvolatile memory devices 1231 to 123n. The data temporarily stored in the buffer memory device 1220 may be transmitted to the host device 1100 or the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 10:
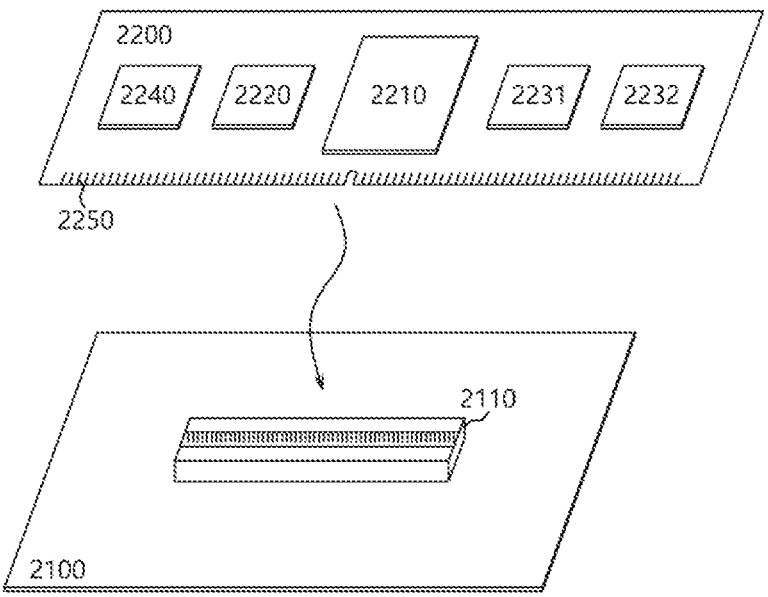
FIGS. 10 and 11 are diagrams illustrating data processing systems each including a memory system in accordance with embodiments of the present disclosure.

FIG. 10 is a diagram illustrating a data processing system 2000 including a memory system in accordance with an embodiment. Referring to FIG. 10, the data processing system 2000 may include a host device 2100 and a memory system 2200.

The host device 2100 may be configured in the form of a board such as a printed circuit board. Although not shown, the host device 2100 may include internal function blocks for performing the functions of a host device.

The host device 2100 may include a connection terminal 2110 such as a socket, a slot, or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control the general operations of the memory system 2200. The controller 2210 may be configured in the same manner as the controller 1210 shown in FIG. 9.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as the storage media of the memory system 2200.

The PMIC 2240 may provide the power inputted through the connection terminal 2250, to the inside of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data, and so forth, and power may be transferred between the host device 2100 and the memory system 2200. The connection terminal 2250 may be constructed into various types depending on an interface scheme between the host device 2100 and the memory system 2200. The connection terminal 2250 may be disposed on any one side of the memory system 2200.

Figure 11:
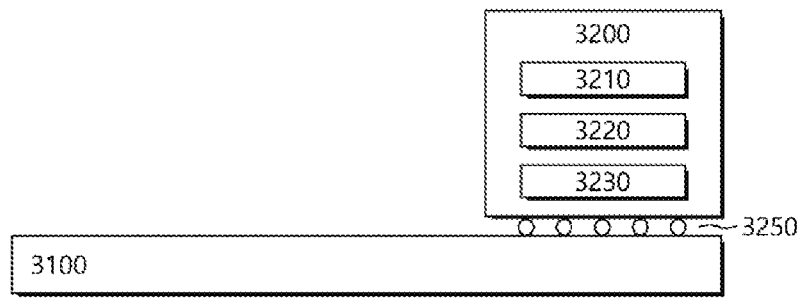

FIG. 11 is a diagram illustrating a data processing system 3000 including a memory system in accordance with an embodiment. Referring to FIG. 11, the data processing system 3000 may include a host device 3100 and a memory system 3200.

The host device 3100 may be configured in the form of a board such as a printed circuit board. Although not shown, the host device 3100 may include internal function blocks for performing the functions of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control the general operations of the memory system 3200. The controller 3210 may be configured in the same manner as the controller 1210 shown in FIG. 9.

The buffer memory device 3220 may temporarily store data to be stored in the nonvolatile memory device 3230. Further, the buffer memory device 3220 may temporarily store the data read out from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 12:
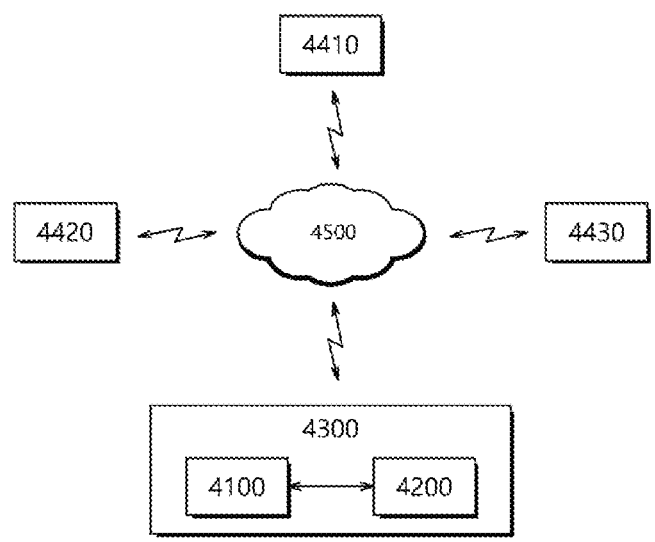
FIG. 12 is a diagram illustrating a network system including a memory system in accordance with an embodiment of the present disclosure.

FIG. 12 is a diagram illustrating a network system 4000 including a memory system in accordance with an embodiment. Referring to FIG. 12, the network system 4000 may include a server system 4300 and a plurality of client systems 4410 to 4430 which are coupled through a network 4500.

The server system 4300 may serve data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and a memory system 4200. The memory system 4200 may be configured by the memory system 100 of FIG. 1, the SSD 1200 of FIG. 9, the memory system 2200 of FIG. 10, or the memory system 3200 of FIG. 11.

While various embodiments have been described above, it will be understood to those skilled in the art that the embodiments described are examples only. Accordingly, the operating method of the memory system described herein should not be limited based on the described embodiments.

What is claimed is:

1. A memory system comprising:
a memory cell array including a plurality of memory cells;
a peripheral circuit configured to apply a read voltage to a selected word line coupled to a selected memory cell among the memory cells and apply a pass voltage to unselected word lines coupled to unselected memory cells other than the selected memory cell among the memory cells, during a read operation; and
a controller configured to vary the pass voltage based on an erase count of a target memory block which is a target of the read operation and control the peripheral circuit to apply the varied pass voltage to the target memory block,
wherein a voltage level of the pass voltage is varied in inverse proportion to the erase count of the target memory block.

2. The memory system according to claim 1, wherein the peripheral circuit comprises:
a voltage generation circuit configured to generate the read voltage and the pass voltage in response to an operation signal;
a row decoder configured to transfer the read and pass voltages to the selected word line and the unselected word lines in response to a row address;
a column decoder configured to exchange data through a bit line coupled to the memory cell array in response to a column address;
a control logic configured to control the peripheral circuit based on control of the controller; and
an input and output (input/output) circuit configured to receive a command from the controller, transfer the received command to the control logic, and exchange data with the controller.

3. The memory system according to claim 1, wherein the controller controls the peripheral circuit to reduce and apply the voltage level of the pass voltage when the erase count of the target memory block increases.

4. The memory system according to claim 1, wherein the controller controls the peripheral circuit to start the operation of applying the varied pass voltage when the erase count of the target memory block reaches a preset reference value.

5. The memory system according to claim 1, wherein the controller manages a copy block selection reference value for selecting a memory block which is a target of an internal copy operation for data stored in the memory cell array, and varies the copy block selection reference value according to the erase count.

6. The memory system according to claim 5, wherein the copy block selection reference value is set based on a read count of each of the memory blocks.

7. The memory system according to claim 6, wherein the controller reduces and applies the read count corresponding to the copy block selection reference value, when the erase count of the target memory block increases.

8. The memory system according to claim 5, wherein the internal copy operation comprises a garbage collection operation or a read reclaim operation.

9. The memory system according to claim 1, wherein the peripheral circuit applies the varied pass voltage to the target memory block when a read command for data stored in the memory cell array is received from the controller.

10. An operating method for a memory system which includes a nonvolatile memory device including a plurality of memory blocks and a controller for controlling an operation of the nonvolatile memory device, the operating method comprising:
determining an erase count of a target memory block in which read request data is stored;
varying a pass voltage based on the erase count of the target memory block; and
applying a read voltage to a selected word line, and the varied pass voltage to unselected word lines,
wherein a voltage level of the pass voltage is varied in inverse proportion to the erase count of the target memory block.

11. The operating method according to claim 10, wherein the applying the read voltage and the varied pass voltage comprises:
generating the read voltage and the varied pass voltage in response to an operation signal; and
transferring the read voltage and the varied pass voltage to the selected word line and the unselected word lines, respectively, in response to a row address.

12. The operating method according to claim 10, wherein, in the varying of the pass voltage, the voltage level of the pass voltage is reduced when an erase count of the target memory block increases.

13. The operating method according to claim 10, further comprising:
determining a copy block selection reference value for selecting a memory block which is a target of an internal copy operation, based on the erase count; and
performing the internal copy operation on a memory block that satisfies the copy block selection reference value.

14. The operating method according to claim 13, wherein the determining of the copy block selection reference value includes determining the copy block selection reference value in which a read count of each of the memory blocks is applied as an index, based on the erase count.

15. The operating method according to claim 14, wherein the determining of the copy block selection reference value includes reducing the read count which is the copy block selection reference value, when the erase count of the target memory block increases.

16. The operating method according to claim 13, wherein the internal copy operation includes a garbage collection operation or a read reclaim operation.

17. A memory system comprising:
a memory device including a plurality of memory blocks;
a controller configured to determine an erase count value of a target memory block for a read operation among the plurality of memory blocks; and
a peripheral circuit configured to:
  generate a read voltage;
  generate a pass voltage varied based on the erase count value; and
  apply the read voltage and the pass voltage to a selected word line and unselected word lines, respectively, the selected word line coupled to a selected memory cell of the target memory block, and the unselected word lines coupled to unselected memory cells of the target memory block,
wherein a voltage level of the pass voltage is varied in inverse proportion to the erase count value of the target memory block.

* * * * *